United States Patent
Chou et al.

(10) Patent No.: US 10,713,160 B1
(45) Date of Patent: Jul. 14, 2020

(54) DATA WRITING METHOD, MEMORY CONTROL CIRCUIT UNIT AND MEMORY STORAGE DEVICE

(71) Applicant: PHISON ELECTRONICS CORP., Miaoli (TW)

(72) Inventors: Chia-Sheng Chou, Hsinchu County (TW); Chia-Cheng Tu, Kaohsiung (TW); Kuo-Ming Tseng, New Taipei (TW); Yi-Liang Hu, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/358,719

(22) Filed: Mar. 20, 2019

(30) Foreign Application Priority Data

Jan. 30, 2019 (TW) .............................. 108103524 A (51) Int. Cl.
| | |
|---|---|
| *G06F 12/02* | (2006.01) |
| *H03M 13/29* | (2006.01) |
| *H03M 13/35* | (2006.01) |
| *G06F 11/10* | (2006.01) |
| *G11C 29/42* | (2006.01) |

(52) U.S. Cl.
CPC ...... *G06F 12/0246* (2013.01); *G06F 11/1076* (2013.01); *G06F 12/0253* (2013.01); *G11C 29/42* (2013.01); *H03M 13/2906* (2013.01); *H03M 13/356* (2013.01)

(58) Field of Classification Search
CPC ............. G06F 12/0253; G06F 12/0246; G06F 3/0619; G06F 3/0629; G06F 3/0689; G06F 3/0679; G06F 11/1012; G06F 11/1068; G06F 11/1044; G11C 29/42; G11C 29/44; G11C 16/3422
See application file for complete search history.

(56) References Cited

U.S. PATENT DOCUMENTS

| | | | | |
|---|---|---|---|---|
| 2014/0040533 | A1* | 2/2014 | Huang ................ | G06F 12/0246 711/103 |
| 2014/0337681 | A1* | 11/2014 | Liang ................. | G06F 11/1044 714/755 |
| 2018/0225050 | A1* | 8/2018 | Suzuki ................ | G06F 3/0629 |
| 2019/0129776 | A1* | 5/2019 | Hsiao ................ | G11C 16/3422 |

* cited by examiner

*Primary Examiner* — Shelly A Chase
(74) *Attorney, Agent, or Firm* — JCIPRNET (57) ABSTRACT

A data writing method, a memory control circuit unit and a memory storage device are provided. The method includes: executing a first programming operation to data according to a first RAID ECC rate, programming the data into at least a portion of a plurality of first physical programming units, and generating a first RAID ECC; and executing a second programming operation to the data programmed into at least the portion of the first physical programming units according to a second RAID ECC rate, programming the data into at least a portion of a plurality of second physical programming units, and generating a second RAID ECC, wherein the first RAID ECC rate is different from the second RAID ECC rate.

23 Claims, 8 Drawing Sheets

| | |
|---|---|
| $P_1$ | Data |
| $P_2$ | Data |
| | • • • |
| $P_{32}$ | RAID ECC 1 |
| $P_{33}$ | Data |
| | • • • |
| $P_{64}$ | RAID ECC 2 |
| $P_{65}$ | Data |
| | • • • |
| $P_{96}$ | RAID ECC 3 |
| $P_{97}$ | Data |
| | • • • |
| $P_{128}$ | RAID ECC 4 |

| | |
|---|---|
| $P_1$ | Data |
| $P_2$ | Data |
| | ⋮ |
| $P_{32}$ | RAID ECC 1 |
| $P_{33}$ | Data |
| | ⋮ |
| $P_{64}$ | RAID ECC 2 |
| $P_{65}$ | Data |
| | ⋮ |
| $P_{96}$ | RAID ECC 3 |
| $P_{97}$ | Data |
| | ⋮ |
| $P_{128}$ | RAID ECC 4 |

DATA WRITING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 108103524, filed on Jan. 30, 2019. The entirety of the above-mentioned patent application is hereby incorporated by reference herein and made a part of this specification.

BACKGROUND

Technical Field

The invention relates to a data writing method for a rewritable non-volatile memory, and a memory control circuit unit and a memory storage device using the method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when receiving a command sent by the host system, the rewritable non-volatile memory module will execute a host programming operation and a garbage collecting operation according to the same Redundant Array of Independent Disks error checking and correcting code rate (RAID ECC rate) to program data into physical programming units of the rewritable non-volatile memory module, and after the data is programmed into each of the physical programming units, execute a read verifying operation to the data programmed into each of the physical programming units to determine whether the data is correctly programmed into each of the physical programming units. However, the read verifying operation executed to the data programmed into each of the physical programming units will occupy a bandwidth of the rewritable non-volatile memory module. If the read verifying operation fails, it is more time consuming since incorrect data need to be corrected before the host programming operation or the garbage collecting operation can be continuously executed. Therefore, regardless of whether the read verifying operation fails or not, a programming performance of the rewritable non-volatile memory module will be affected. Accordingly, how to quickly find a data writing method that does not affect the performance of the rewritable non-volatile memory module is one of the problems to be solved by persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

A data writing method, a memory control circuit unit and a memory storage device are provided.

An exemplary embodiment of the invention proposes a data writing method for a rewritable non-volatile memory module. The rewritable non-volatile memory module includes a plurality of physical erasing units, and each of the physical erasing units includes a plurality of physical programming units. The method includes: executing a first programming operation to data according to a first RAID ECC rate, programming the data into at least a portion of a plurality of first physical programming units, and generating a first RAID ECC; and executing a second programming operation to the data programmed into at least the portion of the first physical programming units according to a second RAID ECC rate, programming the data into at least a portion of a plurality of second physical programming units, and generating a second RAID ECC, wherein the first RAID ECC rate is different from the second RAID ECC rate.

An exemplary embodiment of the invention provides a memory control circuit unit for a memory storage device. The memory storage device has a rewritable non-volatile memory module, the rewritable non-volatile memory module includes a plurality of physical erasing units, and each of the physical erasing units includes a plurality of physical programming units. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to execute a first programming operation to data according to a first RAID ECC rate, program the data into at least a portion of a plurality of first physical programming units, and generate a first RAID ECC. In addition, the memory management circuit is further configured to execute a second programming operation to the data programmed into at least the portion of the first physical programming units according to a second RAID ECC rate, program the data into at least a portion of a plurality of second physical programming units, and generate a second RAID ECC, Here, the first RAID ECC rate is different from the second RAID ECC rate.

An exemplary embodiment of the invention provides a memory storage device, which includes a connection interface unit, a rewritable non-volatile memory module and a memory control circuit unit. The connection interface unit is configured to couple to a host system. The rewritable non-volatile memory module includes a plurality of physical erasing units, and each of the physical erasing units includes a plurality of physical programming units. The memory control circuit unit is coupled to the connection interface unit and the rewritable non-volatile memory module. The memory control circuit unit is configured to execute a first programming operation to data according to a first RAID ECC rate, program the data into at least a portion of a plurality of first physical programming units, and generate a first RAID ECC. In addition, the memory control circuit unit is further configured to execute a second programming operation to the data programmed into at least the portion of the first physical programming units according to a second RAID ECC rate, program the data into at least a portion of a plurality of second physical programming units, and generate a second RAID ECC, Here, the first RAID ECC rate is different from the second RAID ECC rate.

An exemplary embodiment of the invention proposes a data writing method for a rewritable non-volatile memory module. The rewritable non-volatile memory module includes a plurality of physical erasing units, and each of the physical erasing units includes a plurality of physical programming units. The method includes: receiving a command of a host system for executing a first programming operation to data according to a first RAID ECC rate, programming the data into at least a portion of a plurality of first physical programming units, and generating a first RAID ECC; executing a garbage collecting operation to the data programmed into at least the portion of the first physical programming units according to a second RAID ECC rate, programming the data into at least a portion of a plurality of second physical programming units, and generating a second RAID ECC; and after the data is programmed into at least the portion of the second physical programming units, executing a read verifying operation to the data programmed into each of the second physical programming units. In the step of receiving the command of the host system for executing the first programming operation to the data according to the first RAID ECC rate, programming the data into at least the portion of the first physical programming units, and generating the first RAID ECC, a read verifying operation is not executed to the data programmed into each of the first physical programming units, Here, the first RAID ECC rate is smaller than the second RAID ECC rate.

Based on the above, in the data writing method, the memory control circuit unit and the memory storage device provided by the invention, after the host programming operation is executed and the data is programmed into each of the first physical programming units, it is not required to execute the read verifying operation. Later, the garbage collecting operation may then be executed, and the garbage collecting operation is executed at the background. In this way, the operation of executing the read verifying operation after executing the garbage collecting operation to program the data into each of the second physical programming units will not occupy the bandwidth of the rewritable non-volatile memory module. Further, in the invention, because the garbage collecting operation is executed by using the higher second RAID ECC rate to generate the fewer second RAID ECCs, there is no need to sacrifice the capacity of the rewritable non-volatile memory module for storing the excessive second RAID ECCs so more data can be stored. Also, the host programming operation executed according to the lower first RAID ECC rate can save the time for executing the read verifying operation and can improve the performance of the host system.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 1:
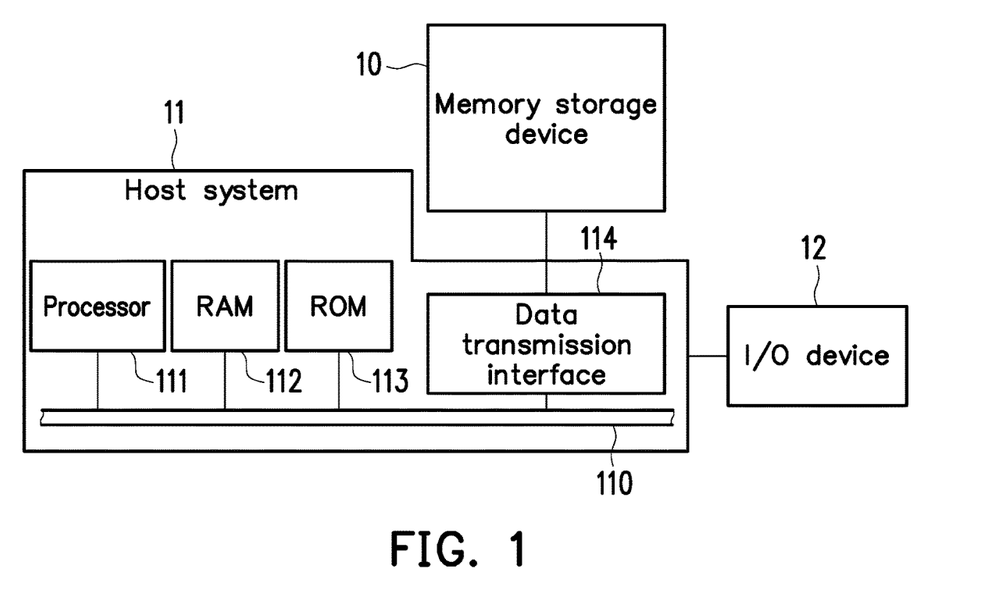
FIG. 1 is a schematic diagram illustrating a host system, a memory storage device and an I/O (input/output) device according to an exemplary embodiment of the invention.
Figure 2:
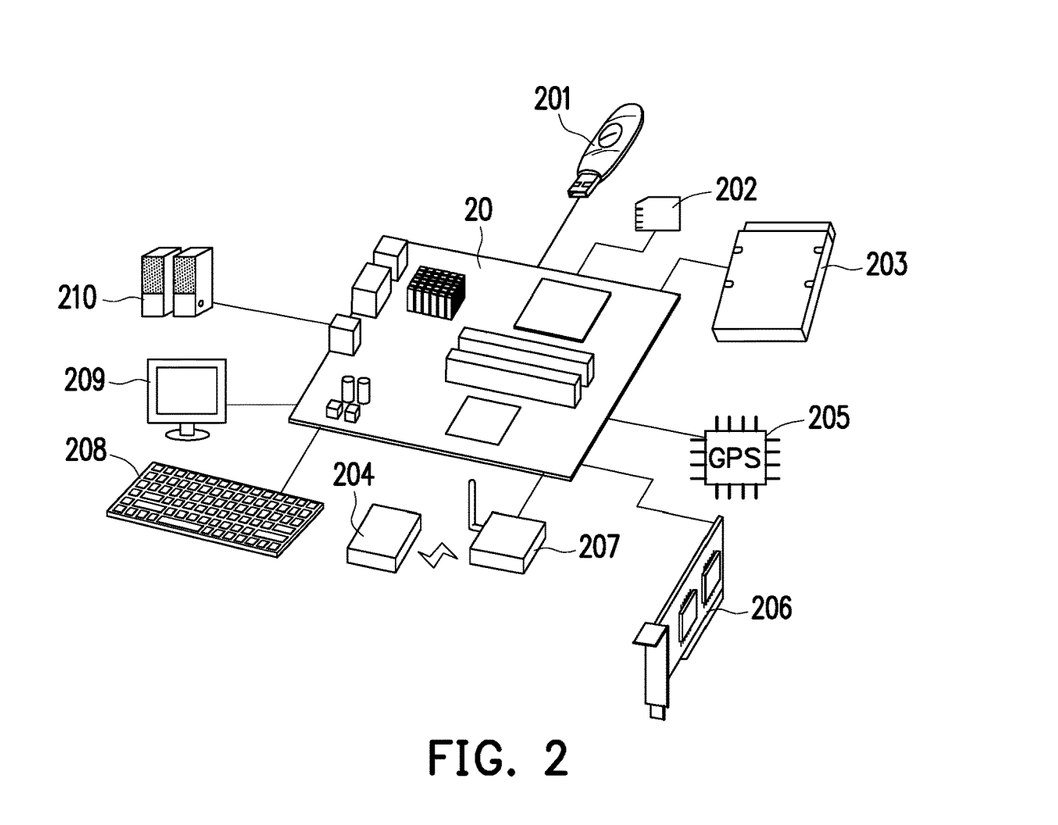
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
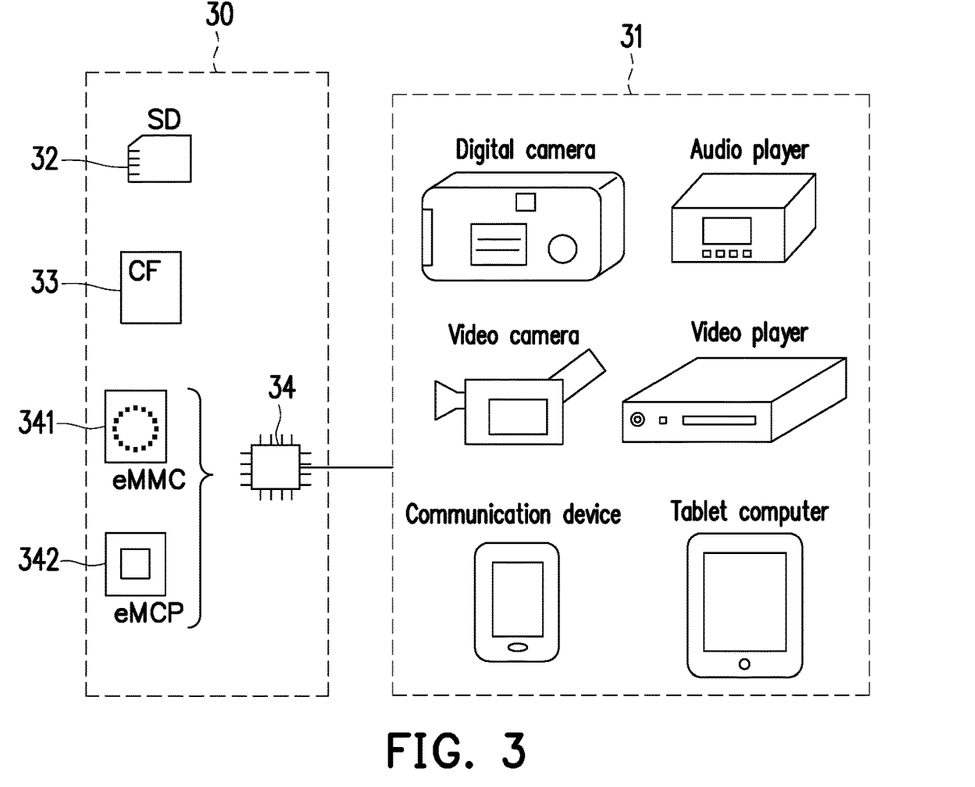
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
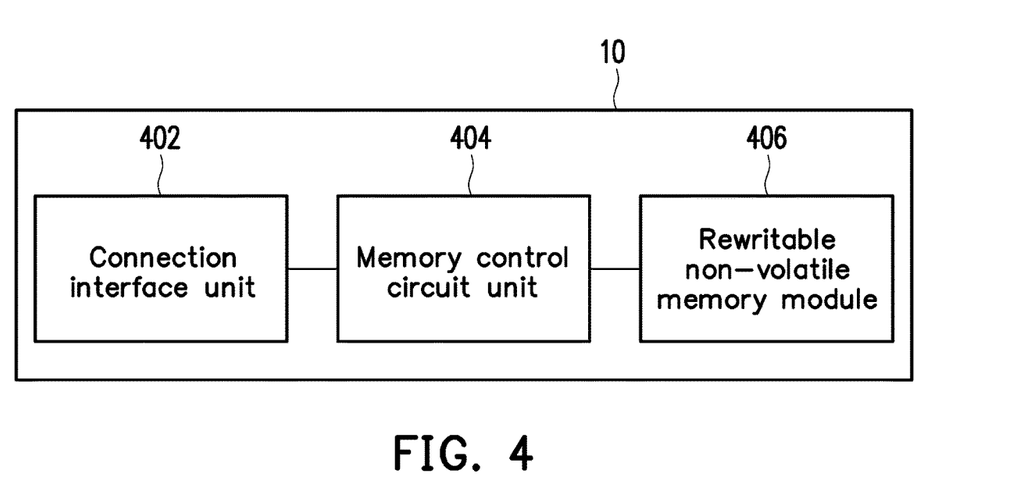
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. In the present exemplary embodiment, the connection interface unit 402 is compatible with a SATA (Serial Advanced Technology Attachment) standard. Nevertheless, it should be understood that the invention is not limited in this regard. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two or more bits, the physical programming units on the same word line can be at least classified into a lower physical programming unit and an upper physical programming unit. For example, a LSB (Least Significant Bit) of one memory cell belongs to the lower physical programming unit, and a MSB (most significant bit) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
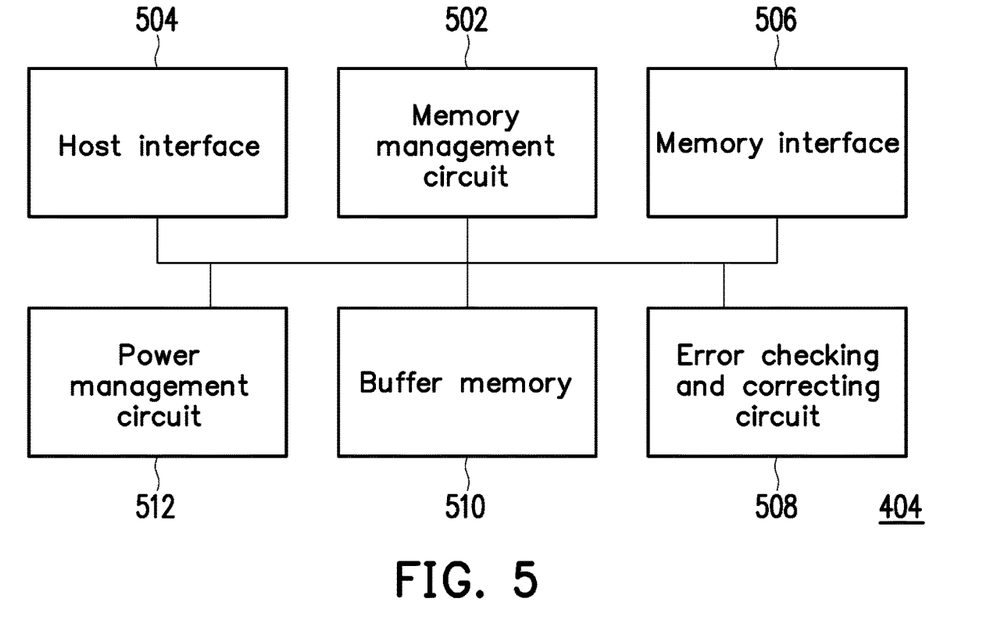
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In this exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor unit to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. the memory reading circuit is configured to issue a read command sequence for the rewritable non-volatile memory module 406 in order to read data from the rewritable non-volatile memory module 406; The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In this exemplary embodiment, the host interface 504 is compatible with the SATA standard. However, it should be understood that the present invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or executing a garbage collecting operation). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 404 further includes a buffer memory 510, an error checking and correcting circuit 508 and a power management circuit 512.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data and the ECC and/or the EDC corresponding to the write command into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation to the read data based on the ECC and/or the EDC.

In this exemplary embodiment, the error checking and correcting circuit 508 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error checking and correcting circuit 508 can encode the data to be protected, so as to generate the corresponding ECC and/or the EDC. For clear description, the ECC and/or the EDC generated by encoding are collectively referred to as encoded data.

Figure 6:
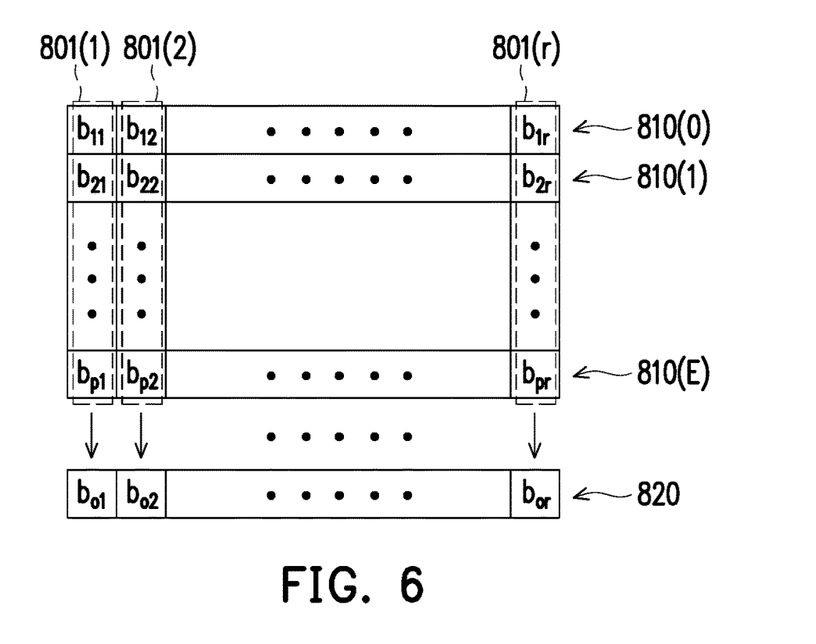
FIG. 6 is a schematic diagram illustrating a multi-frame encoding according to an exemplary embodiment of the invention.

FIG. 6 is a schematic diagram illustrating a multi-frame encoding according to an exemplary embodiment of the invention.

With reference to FIG. 6 that takes encoded data 820 correspondingly generated by encoding the data stored in physical programming units 810(0) to 810(E) as an example, in which at least a part of data stored by each of the physical programming units 810(0) to 810(E) may be regarded as one frame. In the multi-frame encoding, the data in the physical programming units 810(0) to 810(E) are encoded based on each of positions where bits (or bytes) are located. For example, bits $b_{11}$, $b_{21}$, ..., $b_{p1}$ at a position 801(1) are encoded as a bit $b_{o1}$ in the encoded data 820 and bits $b_{12}$, $b_{22}$, ..., $b_{p2}$ at a position 801(2) are encoded as a bit $b_{o2}$ in the encoded data 820; and by analogy, bits $b_{1r}$, $b_{2r}$, ..., $b_{ar}$ at a position 801(r) are encoded as a bit $b_{or}$ in the encoded data 820. Later, the data read from the physical programming units 810(0) to 810(E) may be decoded according to the encoded data 820 so attempts on correcting possible errors in the read data can be made.

Herein, in another exemplary embodiment of FIG. 6, the data used for generating the encoded data 820 may also include redundancy bits corresponding to the data bits in the data stored in the physical programming units 810(0) to 810(E). Taking the data stored in the physical programming unit 810(0) for example, the redundancy bits therein are, for example, generated by performing the single-frame encoding for the data bits stored in the physical programming unit 810(0). In this exemplary embodiment, it is assumed that when the data of the physical programming unit 810(0) is read, the data read from the physical programming unit 810(0) may be decoded by the redundancy bits (e.g., the encoded data of the single-frame encoding) in the physical programming unit 810(0) so as to perform the error check and correct operation. However, when a decoding operation performed by using the redundancy bits in the physical programming unit 810(0) fails (e.g., a number of error bits of the data stored in the physical programming unit 810(0) is greater than a threshold), a retry-read mechanism may be used to attempt reading correct data from the physical programming unit 810(0). When the correct data cannot be read from the physical programming unit 810(0) by using the retry-read mechanism, the encoded data 820 and data of the physical programming units 810(1) to 810(E) may be read and the decoding may be performed according to the encoded data 820 and the data of the physical programming units 810(1) to 810(E) so as to attempt correcting errors included in the data stored in the physical programming unit 810(0). In other words, in this exemplary embodiment, when the decoding operation performed by using the encoded data generated by the single-frame encoding fails and the reading operation performed by using the retry-read mechanism fails, the encoded data generated by the multi-frame encoding will be used for the decoding operation instead.

Figure 7:
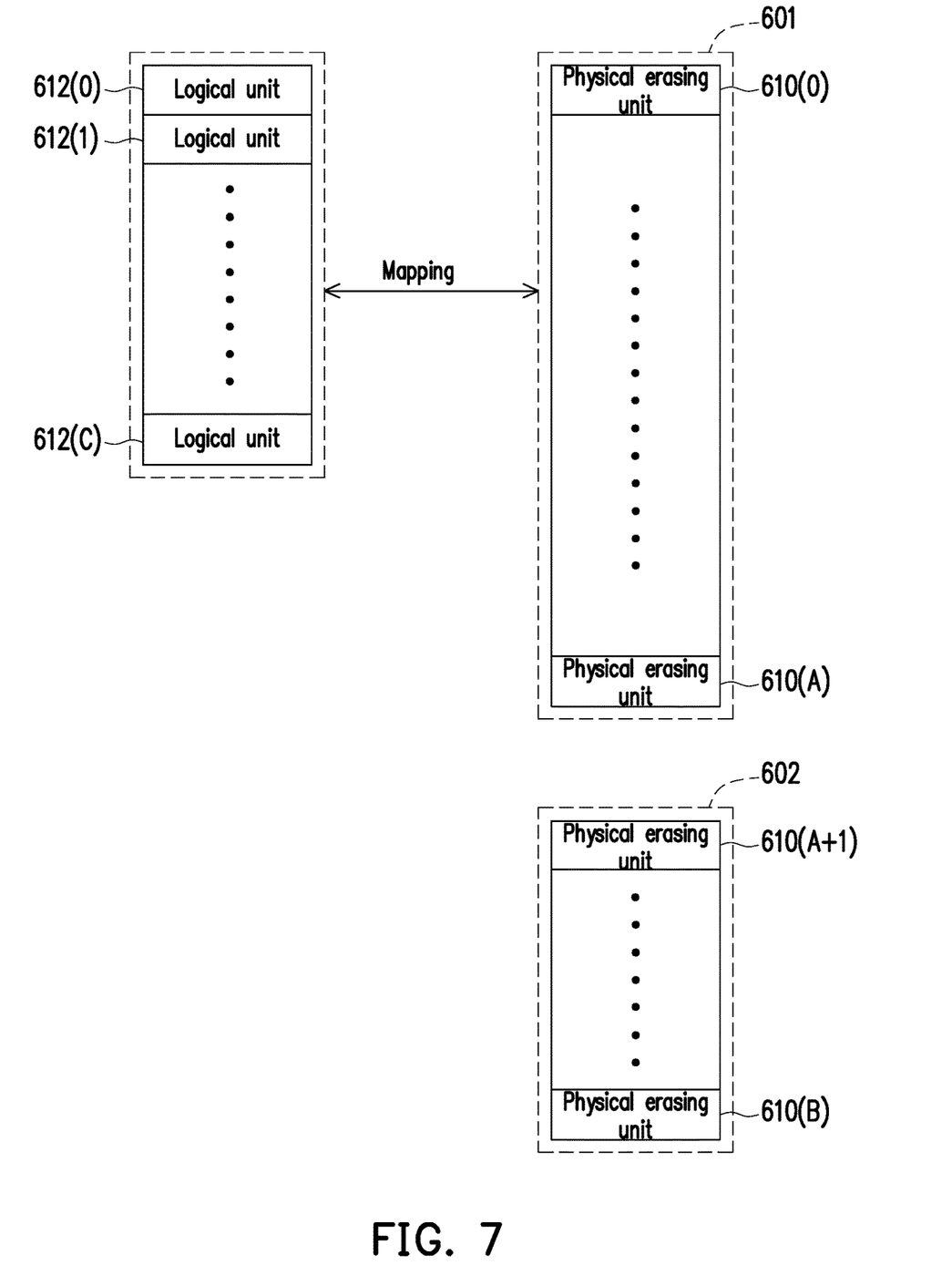
FIG. 7 is a schematic diagram illustrating management of a rewritable non-volatile memory module according to an exemplary embodiment of the invention.

FIG. 7 is a schematic diagram illustrating management of a rewritable non-volatile memory module according to an exemplary embodiment of the invention.

It is noted that terms such as "select" and "group" used for operating the physical erasing units are logical concepts which describe the management for the physical erasing units of the rewritable non-volatile memory module 406 in the following exemplary embodiments. That is, the physical erasing units of the rewritable non-volatile memory module 406 are logically operated, but actual positions of the physical erasing units of the rewritable non-volatile memory module 406 are not changed.

Referring to FIG. 7, the memory management circuit 502 groups physical erasing units 610(0) to 610(B) of the rewritable non-volatile memory module 406 into a storage area 601 and a spare area 602. For example, the physical erasing units 610(0) to 610(A) belong to the storage area 601, and the physical erasing units 610(A+1) to 610(B) belong to the spare area 602. In the present exemplary embodiment, one physical erasing unit refers to one physical erasing unit. However, in another exemplary embodiment, one physical erasing unit may also include a plurality of physical erasing units. In addition, the memory management circuit 502 can associate one specific physical erasing unit with one of the storage area 601 and the spare area 602 by a marking method, etc.

During operation of the memory storage device 10, an association relation between one specific physical erasing unit and the storage area 601 or the spare area 602 may be dynamically changed. For example, when receiving write data from the host system 11, the memory management circuit 502 selects one physical erasing unit from the spare area 602 for storing at least a part of the write data and associates the physical erasing unit with the storage area 601. In addition, after one specific physical erasing unit belonging to the storage area 601 is erased to delete data therein, the memory management circuit 502 associates the specific physical erasing unit being erased with the spare area 602.

In the present exemplary embodiment, the physical erasing unit belonging to the spare area 602 is also known as a spare physical erasing unit, and the physical erasing unit belonging to the storage area 601 is also known as a non-spare physical erasing unit. Each physical erasing unit belonging to the spare area 602 is the physical erasing unit erased and not stored with any data, and each physical erasing unit belonging to the storage area 601 is stored with data. Furthermore, each physical erasing unit belonging to the spare area 602 is not stored with any valid data, and each physical erasing unit belonging to the storage area 601 may be stored with valid data and/or invalid data.

In an exemplary embodiment, the memory management circuit 502 assigns logical units 612(0) to 612(C) for mapping to the physical erasing units in the storage area 601. In the present exemplary embodiment, the host system 11 accesses the physical erasing unit of the storage area 601 through a logical address (LA). Therefore, each logical unit in the logical units 612(0) to 612(C) refers to one logical address. However, in another exemplary embodiment, each logical unit among the logical units 612(0) to 612(C) may also refer to one logical programming unit, one logical erasing unit or a composition of a plurality of consecutive or non-consecutive logical addresses. In addition, each logical unit in the logical units 612(0) to 612(C) may also be mapped to one or more physical erasing units.

In the present exemplary embodiment, the memory management circuit 502 records a mapping relation (also known as a logical-physical mapping relation) between the logical units and the physical erasing units into at least one logical-physical mapping table. When the host system 11 intends to read the data from the memory storage device 10 or write the data into the memory storage device 10, the memory management circuit 502 may access the data in the memory storage device 10 according to the logical-to-physical mapping table.

Figure 8:
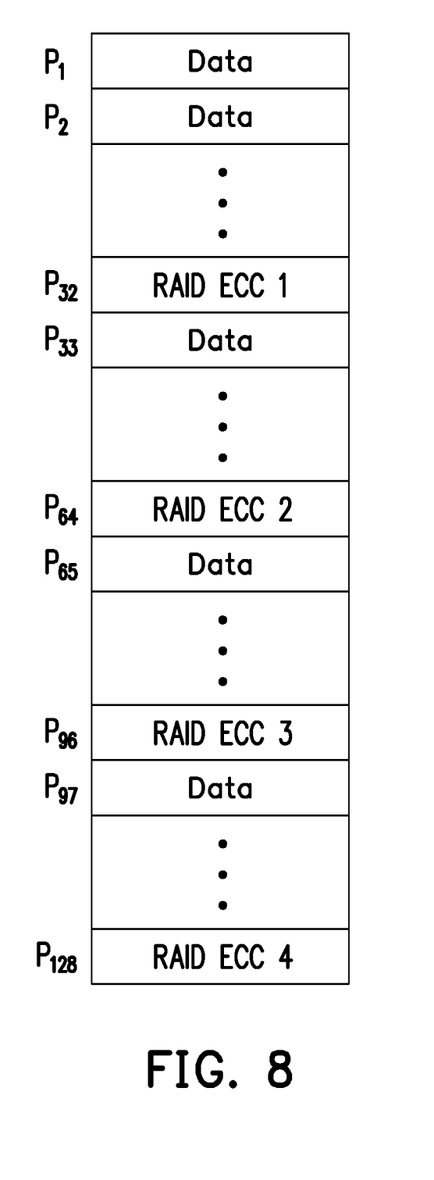
FIG. 8 is a schematic diagram illustrating a host programming operation executed to data according to an exemplary embodiment of the invention.

FIG. 8 is a schematic diagram illustrating a host programming operation executed to data according to an exemplary embodiment of the invention.

With reference to FIG. 8, when executing the host programming operation to the data, based on the characteristics of the rewritable non-volatile memory module 406 (e.g., when the data is programmed into a plurality of physical programming units of the rewritable non-volatile memory module 406, per each 31 physical programming units being programmed, error bits may appear in one physical programming unit) the memory management circuit 502 sets a first RAID (Redundant Array of Independent Disks) error checking and correcting code rate (hereinafter, also known as a first RAID ECC rate) to a lower RAID ECC rate. For example, the first RAID ECC rate may be set to 31:1. The memory management circuit 502 programs data into at least a portion of a first number of a plurality of first physical programming units of the rewritable non-volatile memory module 406 according to the first RAID ECC rate being set to 31:1. That is to say, each time when programming the data into 31 first physical programming units, the memory management circuit 502 will correspondingly generate a first RAID error checking and correcting code (hereinafter, also known as a first RAID ECC) having a size of one physical programming unit.

As shown by FIG. 8, in the example where the data is programmed into the first physical programming units $P_1$ to $P_{128}$, when programming the data into the first physical programming units $P_1$ to $P_{31}$ according to the first RAID ECC rate, the memory management circuit 502 correspondingly generates a RAID ECC1 having the size of one physical programming unit and stores the RAID ECC1 in the first physical programming unit $P_{32}$. By analogy, when programming the data into the first physical programming units $P_{33}$ to $P_{63}$, the memory management circuit 502 correspondingly generates a RAID ECC2 having the size of one physical programming unit and stores the RAID ECC2 in the first physical programming unit $P_{64}$. When programming the data into the first physical programming units $P_{65}$ to $P_{95}$, the memory management circuit 502 correspondingly generates a RAID ECC3 having the size of one physical programming unit and stores the RAID ECC3 in the first physical programming unit $P_{96}$. When programming the data into the first physical programming units $P_{97}$ to $P_{127}$, the memory management circuit 502 correspondingly generates a RAID ECC4 having the size of one physical programming unit and stores the RAID ECC4 in the first physical programming unit $P_{128}$. In this case, when programming the data into 124 first physical programming units (i.e., programming the data into the first physical programming units $P_1$ to $P_{31}$, $P_{33}$ to $P_{63}$, $P_{65}$ to $P_{95}$ and $P_{97}$ to $P_{127}$), the memory management circuit 502 correspondingly generates the first RAID ECCs having the size of four physical programming units (i.e., including the RAID ECC1 to the RAID ECC4). In other words, when the memory management circuit 502 executes the host programming operation and programs the data into 124 first physical programming units (i.e., the first physical programming units $P_1$ to $P_{31}$, $P_{33}$ to $P_{63}$, $P_{65}$ to $P_{95}$ and $P_{97}$ to $P_{127}$) according to the first RAID ECC rate, the correspondingly generated first RAID ECCs (i.e., including RAID ECC1 to RAID ECC4) are stored in the first physical programming units $P_{32}$, $P_{64}$, $P_{96}$ and $P_{128}$. In this exemplary embodiment, at least a portion of the data stored by each set of the first physical programming units $P_1$ to $P_{31}$, $P_{33}$ to $P_{63}$, $P_{65}$ to $P_{95}$ and $P_{97}$ to $P_{127}$ may be regarded as one frame. For example, at least the portion of the data stored in the first physical programming units $P_1$ to $P_{31}$ may be regard as one frame. The first RAID ECCs (i.e., the RAID ECC1 to the RAID ECC4) are correspondingly generated by executing the multi-frame encoding to at least the portion of data stored in each set of the first physical programming units $P_1$ to $P_{31}$, $P_{33}$ to $P_{63}$, $P_{65}$ to $P_{95}$ and $P_{97}$ to $P_{127}$. In the exemplary embodiment described above, when executing the host programming operation to the data, the memory management circuit 502 does not perform a read verifying operation to the data programmed into each of the first physical programming units $P_1$ to $P_{31}$, $P_{33}$ to $P_{63}$, $P_{65}$ to $P_{95}$ and $P_{97}$ to $P_{127}$.

Figure 9:
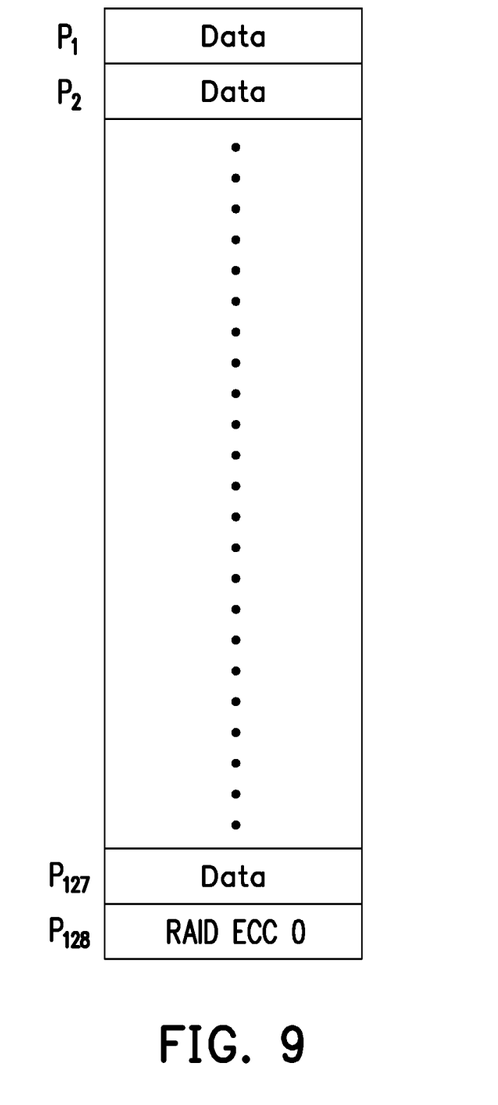
FIG. 9 is a schematic diagram illustrating a garbage collecting operation executed to data according to an exemplary embodiment of the invention.

FIG. 9 is a schematic diagram illustrating a garbage collecting operation executed to data according to an exemplary embodiment of the invention.

With reference to FIG. 9, in an exemplary embodiment, when executing the garbage collecting operation, the memory management circuit 502 sets a second RAID error checking and correcting code rate (hereinafter, also known as a second RAID ECC rate) to be higher than the first RAID ECC rate. For example, the second RAID ECC rate may be set to 127:1. The memory management circuit 502 programs the data programmed into at least the portion of the first number of the first physical programming units into at least a portion of a second number of a plurality of second physical programming units of the rewritable non-volatile memory module 406 according to the second RAID RATE being set to 127:1. That is to say, each time when programming the data into 127 second physical programming units, the memory management circuit 502 will correspondingly generate a second RAID error checking and correcting code (hereinafter, also known as a second RAID ECC) having a size of one physical programming unit.

As shown by FIG. 9, when programming the data into the second physical programming units $P_1$ to $P_{127}$ according to the second RAID ECC rate, the memory management circuit 502 correspondingly generates a RAID ECC0 having the size of one physical programming unit and stores the RAID ECC0 in the second physical programming unit $P_{128}$. In other words, when executing the garbage collecting operation, the memory management circuit 502 programs the data into 127 second physical programming units (i.e., the second physical programming units $P_1$ to $P_{127}$) according to the second RAID ECC rate, and stores the correspondingly generated second RAID ECC (i.e., the RAID ECC0) in the second physical programming unit $P_{128}$. Here, at least a portion of the data stored in each of the second physical programming units $P_1$ to $P_{127}$ may be regarded as one frame. The second RAID ECC (i.e., the RAID ECC0) is correspondingly generated by executing the multi-frame encoding to at least the portion of the data stored in the second physical programming units $P_1$ to $P_{127}$. In the exemplary embodiment described above, in the garbage collecting operation, the memory management circuit 502 executes the read verifying operation to the data programmed into each of the second physical programming units $P_1$ to $P_{127}$.

In an exemplary embodiment, the memory management circuit 502 receives a command sent by the host system 11 for executing the host programming operation. The memory management circuit 502 programs the data into at least a portion of a first number of a plurality of first physical programming units of the rewritable non-volatile memory module 406 according to a first RAID ECC rate, and correspondingly generates a first RAID ECC. In an exemplary embodiment, based on the characteristics of the rewritable non-volatile memory module 406, the memory management circuit 502 sets the first RAID ECC rate to 31:1.

When the memory management circuit 502 reads the data programmed into at least the portion of the first number of the first physical programming units in the rewritable non-volatile memory module 406, if the decoding executed by using the encoded data generated by the single-frame encoding fails and the reading using the retry-read mechanism fails, the memory management circuit 502 executes a RAID error correcting operation to the data programmed into at least the portion of the first number of the first physical programming units in the rewritable non-volatile memory module 406 according to the first RAID ECC generated by the multi-frame encoding, so as to correct error bits appearing in the data. In this exemplary embodiment described above, when executing the host programming operation to the data, the memory management circuit 502 does not perform a read verifying operation to the data programmed into each of the first physical programming units.

Later, the memory management circuit 502 executes the garbage collecting operation, programs the data programmed into at least the portion of the first number of the first physical programming units into at least a portion of a second number of a plurality of second physical programming units according to a second RAID ECC rate, and correspondingly generates a second RAID ECC. In an exemplary embodiment, the memory management circuit 502 sets the second RAID ECC rate to 127:1. Further, after programming each of the second physical programming units, the memory management circuit 502 executes the read verifying operation to the data programmed into the second physical programming units, so as to determine whether the data is correctly programmed into each of the second physical programming units. If the read verifying operation fails, it is determined that the data is not correctly programmed into the second physical programming unit (i.e., quitting programming the data into said second physical programming unit), and the data is then programmed into another physical programming unit (a.k.a. a third physical programming unit) different from said second physical programming unit. If the read verifying operation does not fail, it is determined that the data is correctly programmed into the second physical programming units, and the garbage collecting operation is ended.

Specifically, in the exemplary embodiment described above, because the first RAID ECCs correspondingly generated by the memory management circuit 502 executing the host programming operation according to the first RAID ECC rate is more than the second RAID ECC correspondingly generated by the memory management circuit 502 executing the garbage collecting operation according to the second RAID ECC rate, after executing the host programming operation, the memory management circuit 502 can correct error bits appearing in the data according to the RAID error correcting operation and the correspondingly generated first RAID ECC. In addition, the memory management circuit 502 does not execute the read verifying operation to the data programmed into each of the first physical programming units.

Figure 10:
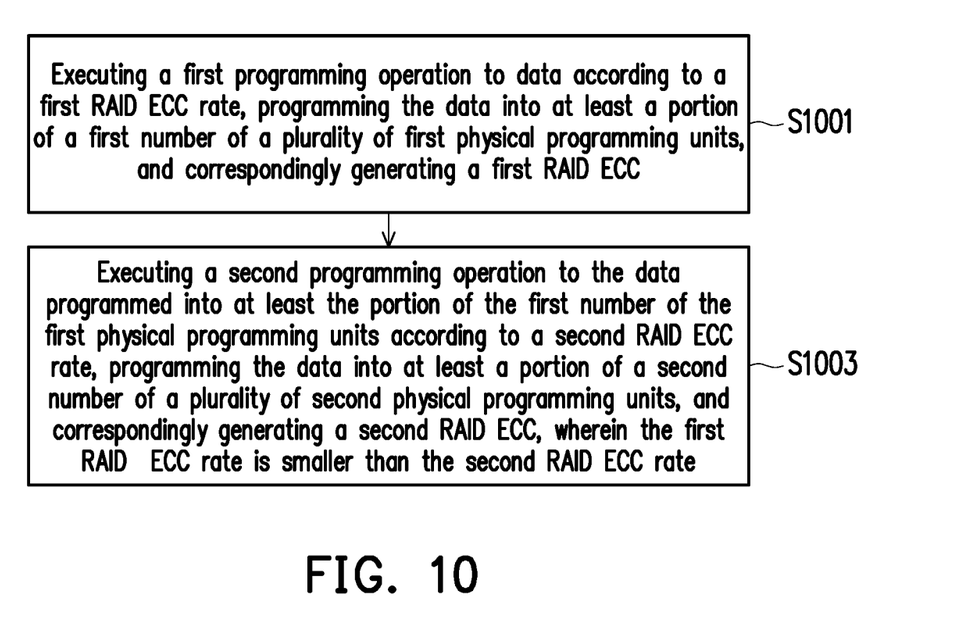
FIG. 10 is a flowchart illustrating a data writing method according to an exemplary embodiment of the invention.

FIG. 10 is a flowchart illustrating a data writing method according to an exemplary embodiment of the invention.

With reference to FIG. 10, in step S1001, the memory management circuit 502 executes a first programming operation to data according to a first RAID ECC rate, programs the data into at least a portion of a first number of a plurality of first physical programming units, and correspondingly generates a first RAID ECC.

In step S1003, the memory management circuit 502 executes a second programming operation to the data programmed into at least the portion of the first number of the first physical programming units according to a second RAID ECC rate, programs the data into at least a portion of a second number of a plurality of second physical programming units, and correspondingly generates a second RAID ECC, wherein the first RAID rate is smaller than the second RAID ECC rate.

Figure 11:
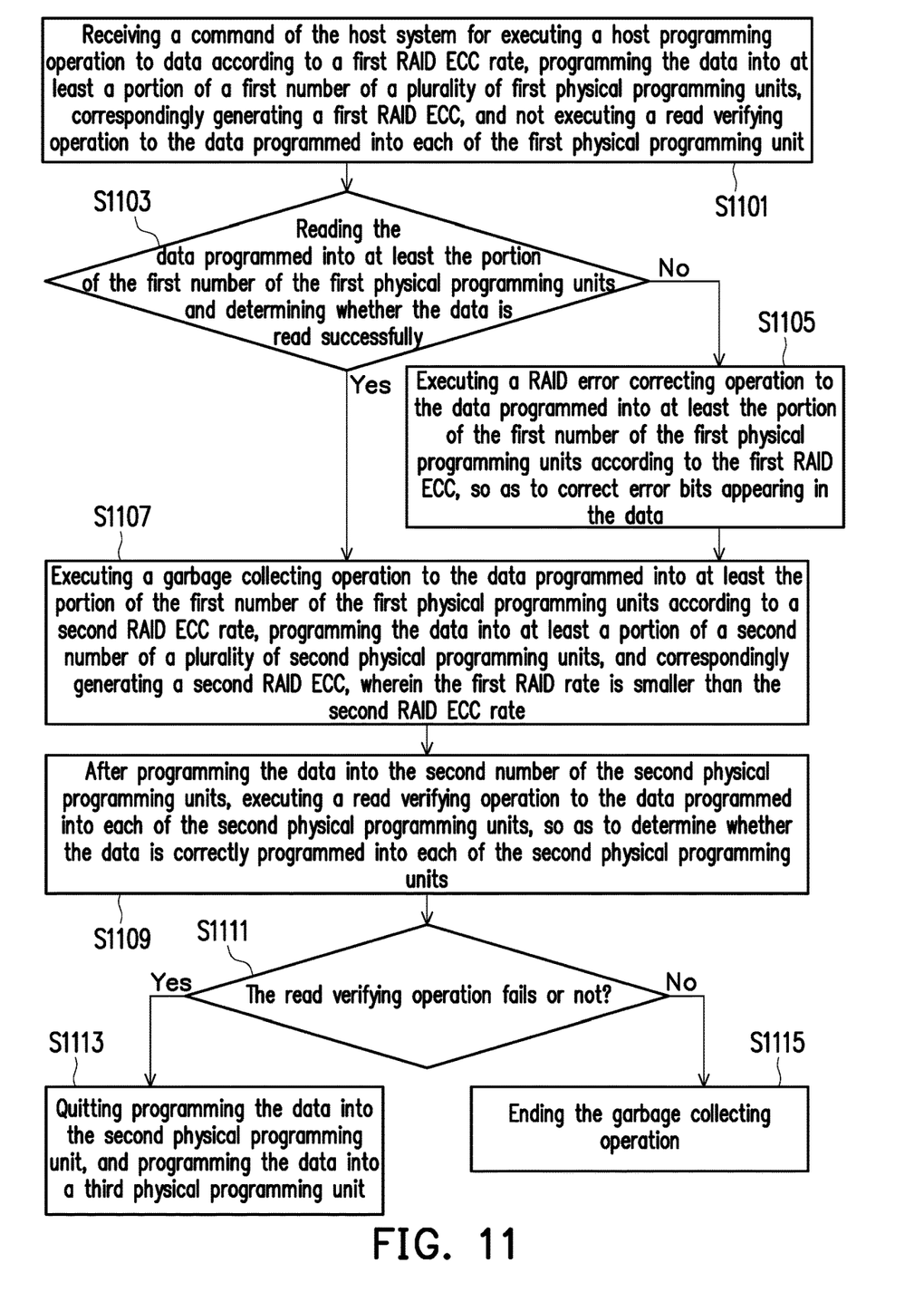
FIG. 11 is a flowchart illustrating a data writing method according to another exemplary embodiment of the invention.

FIG. 11 is a flowchart illustrating a data writing method according to another exemplary embodiment of the invention.

With reference to FIG. 11, in step S1101, the memory management circuit 502 receives a command of the host system 11 and executes a host programming operation to data according to a first RAID ECC rate, and then the memory management circuit 502 programs the data into at least a portion of a first number of a plurality of first physical programming units, and correspondingly generates a first RAID ECC. Further, in step S1101, the memory management circuit 502 does not execute a read verifying operation to the data programmed into each of the first physical programming unit.

In step S1103, the memory management circuit 502 reads the data programmed into at least the portion of the first number of the first physical programming units and determines whether the data is read successfully.

In step S1105, if the data is read unsuccessfully, the memory management circuit 502 executes a RAID error correcting operation to the data programmed into at least the portion of the first number of the first physical programming units according to the first RAID ECC, so as to correct error bits appearing in the data.

In step S1107, if the data is read successfully, the memory management circuit 502 executes a garbage collecting operation to the data programmed into at least the portion of the first number of the first physical programming units according to a second RAID ECC rate, and then the memory management circuit 502 programs the data into at least a portion of a second number of a plurality of second physical programming units and correspondingly generates a second RAID ECC, wherein the first RAID rate is smaller than the second RAID ECC rate.

In step S1109, after programming the data into the second number of the second physical programming units, the memory management circuit 502 executes a read verifying operation to the data programmed into each of the second physical programming units, so as to determine whether the data is correctly programmed into each of the second physical programming units.

In step S1111, the memory management circuit 502 determines whether the read verifying operation fails.

In step S1113, if the read verifying operation fails, the memory management circuit 502 determines that the data is not correctly programmed into the second physical programming unit, quits programming the data into said second physical programming unit, and programs the data into a third physical programming unit.

In step S1115, if the read verifying operation does not fail, it is determined that the data is correctly programmed into the second physical programming units, and the garbage collecting operation is ended.

In summary, according to the data writing method, the memory control circuit unit and memory storage device provided by the invention, when executing the host programming operation, the memory control circuit unit 502 sets the RAIDECC rate to the lower first RAID ECC rate based on the characteristics of rewritable non-volatile memory modules for generating more first RAID ECCs so the more first RAID ECCs may be used to correct the error bits appeared after executing the error correcting operation. Further, after programming the data into each of the first physical programming units, the memory management circuit 502 does not have to execute the read verifying operation to the data programmed into each of the first physical programming units. Later, when executing the garbage collecting operation, the memory management circuit 502 sets the RAID ECC rate to the higher second RAID ECC rate for generating fewer second RAID ECCs to avoid storing excessive RAID ECCs so more data can be stored instead.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module, wherein the rewritable non-volatile memory module comprises a plurality of physical erasing units, each of the physical erasing units comprises a plurality of physical programming units, and the data writing method comprises:
    executing a first programming operation to data according to a first RAID ECC rate, programming the data into at least a portion of a plurality of first physical programming units, and generating a first RAID ECC; and
    executing a second programming operation to the data programmed into at least the portion of the first physical programming units according to a second RAID ECC rate, programming the data into at least a portion of a plurality of second physical programming units, and generating a second RAID ECC,
    wherein the first RAID ECC rate is different from the second RAID ECC rate.

2. The data writing method according to claim 1, wherein the first RAID ECC rate is calculated according to a first number of the first physical programming units, and the second RAID ECC rate is calculated according to a second number of the second physical programming units.

3. The data writing method according to claim 1, wherein the first programming operation is a host programming operation, and the second programming operation is a garbage collecting operation.

4. The data writing method according to claim 3, wherein the first RAID ECC rate is smaller than the second RAID ECC rate.

5. The data writing method according to claim 1, wherein the step of executing the first programming operation to the data according to the first RAID ECC rate, programming the data into at least the portion of the first physical programming units, and generating the first RAID ECC further comprises:
    reading the data programmed into at least the portion of the first physical programming units and determining whether the data is read successfully.

6. The data writing method according to claim 5, wherein the step of reading the data programmed into at least the portion of the first physical programming units and determining whether the data is read successfully further comprises:
    if the data is read unsuccessfully, executing a RAID error correcting operation to the data programmed into at least the portion of the first physical programming units according to the first RAID ECC, so as to correct error bits appearing in the data programmed into at least the portion of the first physical programming units.

7. The data writing method according to claim 1, wherein the step of executing the second programming operation to the data programmed into at least the portion of the first physical programming units according to the second RAID ECC rate, programming the data into at least the portion of the second physical programming units, and generating the second RAID ECC further comprises:
    after the data is programmed into at least the portion of the second physical programming units, executing a read verifying operation to the data programmed into each of the second physical programming units.

8. A memory control circuit unit for a memory storage device, wherein the memory storage device has a rewritable non-volatile memory module, the rewritable non-volatile memory module comprises a plurality of physical erasing units, each of the physical erasing units comprises a plurality of physical programming units, and the memory control circuit unit comprises:
    a host interface, configured to couple to a host system;
    a memory interface, configured to couple to the rewritable non-volatile memory module;
    a memory management circuit, coupled to the host interface and the memory interface;
    wherein the memory management circuit is configured to execute a first programming operation to data according to a first RAID ECC rate, program the data into at least a portion of a plurality of first physical programming units, and generate a first RAID ECC,
    wherein the memory management circuit is configured to execute a second programming operation to the data programmed into at least the portion of the first physical programming units according to a second RAID ECC rate, program the data into at least a portion of a plurality of second physical programming units, and generate a second RAID ECC, wherein the first RAID ECC rate is different from the second RAID ECC rate.

9. The memory control circuit unit according to claim 8, wherein the first RAID ECC rate is calculated according to a first number of the first physical programming units, and the second RAID ECC rate is calculated according to a second number of the second physical programming units.

10. The memory control circuit unit according to claim 8, wherein the first programming operation is a host programming operation, and the second programming operation is a garbage collecting operation.

11. The memory control circuit unit according to claim 10, wherein the first RAID ECC rate is smaller than the second RAID ECC rate.

12. The memory control circuit unit according to claim 8, wherein in the operation where the memory management circuit is configured to execute the first programming operation to the data according to the first RAID ECC rate, program the data into at least the portion of the first physical programming units, and generate the first RAID ECC,
    the memory management circuit is further configured to read the data programmed into at least the portion of the first physical programming units and determine whether the data is read successfully.

13. The memory control circuit unit according to claim 12, wherein in the operation where the memory management circuit is configured to read the data programmed into at least the portion of the first physical programming units and determine whether the data is read successfully,
    if the data is read unsuccessfully, the memory management circuit is further configured to execute a RAID error correcting operation to the data programmed into at least the portion of the first physical programming units according to the first RAID ECC, so as to correct error bits appearing in the data programmed into at least the portion of the first physical programming units.

14. The memory control circuit unit according to claim 8, wherein in the operation where the memory management circuit is configured to execute the second programming operation to the data programmed into at least the portion of the first physical programming units according to the second RAID ECC rate, program the data into at least the portion of the second physical programming units, and generate the second RAID ECC,
    after the data is programmed into at least the portion of the second physical programming units, the memory management circuit is further configured to execute a read verifying operation to the data programmed into each of the second physical programming units.

15. A memory storage device, comprising:
    a connection interface unit, configured to couple to a host system;
    a rewritable non-volatile memory module; and
    a memory control circuit unit, coupled to the connection interface unit and the rewritable non-volatile memory module, the rewritable non-volatile memory module comprises a plurality of physical erasing units, each of the physical erasing units comprises a plurality of physical programming units,
    wherein the memory control circuit unit is configured to execute a first programming operation to data according to a first RAID ECC rate, program the data into at least a portion of a plurality of first physical programming units, and generate a first RAID ECC,
    wherein the memory control circuit unit is configured to execute a second programming operation to the data programmed into at least the portion of the first physical programming units according to a second RAID ECC rate, program the data into at least a portion of a plurality of second physical programming units, and generate a second RAID ECC, wherein the first RAID ECC rate is different from the second RAID ECC rate.

16. The memory storage device according to claim 15, wherein the first RAID ECC rate is calculated according to a first number of the first physical programming units, and the second RAID ECC rate is calculated according to a second number of the second physical programming units.

17. The memory storage device according to claim 15, wherein the first programming operation is a host programming operation, and the second programming operation is a garbage collecting operation.

18. The memory storage device according to claim 17, wherein the first RAID ECC rate is smaller than the second RAID ECC rate.

19. The memory storage device according to claim 15, wherein in the operation where the memory control circuit unit is configured to execute the first programming operation to the data according to the first RAID ECC rate, program the data into at least the portion of the first physical programming units, and generate the first RAID ECC,
    the memory control circuit unit is further configured to read the data programmed into at least the portion of the first physical programming units and determine whether the data is read successfully.

20. The memory storage device according to claim 19, wherein in the operation where the memory control circuit unit is configured to read the data programmed into at least the portion of the first physical programming units and determine whether the data is read successfully,
    if the data is read unsuccessfully, the memory control circuit unit is further configured to execute a RAID error correcting operation to the data programmed into at least the portion of the first physical programming units according to the first RAID ECC, so as to correct error bits appearing in the data programmed into at least the portion of the first physical programming units.

21. The memory storage device according to claim 15, wherein in the operation where the memory control circuit unit is configured to execute the second programming operation to the data programmed into at least the portion of the first physical programming units according to the second RAID ECC rate, program the data into at least the portion of the second physical programming units, and generate the second RAID ECC,     after the data is programmed into at least the portion of the second physical programming units, the memory control circuit unit is further configured to execute a read verifying operation to the data programmed into each of the second physical programming units.

22. A data writing method for a rewritable non-volatile memory module, wherein the rewritable non-volatile memory module comprises a plurality of physical erasing units, each of the physical erasing units comprises a plurality of physical programming units, and the data writing method comprises:

receiving a command of a host system for executing a first programming operation to data according to a first RAID ECC rate, programming the data into at least a portion of a plurality of first physical programming units, and generating a first RAID ECC;

executing a garbage collecting operation to the data programmed into at least the portion of the first physical programming units according to a second RAID ECC rate, programming the data into at least a portion of a plurality of second physical programming units, and generating a second RAID ECC; and     after the data is programmed into at least the portion of the second physical programming units, executing a read verifying operation to the data programmed into each of the second physical programming units,     wherein in the step of receiving the command of the host system for executing the first programming operation to the data according to the first RAID ECC rate, programming the data into at least the portion of the first physical programming units, and generating the first RAID ECC, a read verifying operation is not executed to the data programmed into each of the first physical programming units,     wherein the first RAID ECC rate is smaller than the second RAID ECC rate.

23. The data writing method according to claim 22, wherein the first RAID ECC rate is calculated according to a first number of the first physical programming units, and the second RAID ECC rate is calculated according to a second number of the second physical programming units.

\* \* \* \* \*